United States Patent
Mano

(10) Patent No.: US 6,339,554 B1
(45) Date of Patent: Jan. 15, 2002

(54) SEMICONDUCTOR MEMORY DEVICE WITH REPLACEMENT PROGRAMMING CIRCUIT

(75) Inventor: Ryuji Mano, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/705,731

(22) Filed: Nov. 6, 2000

(30) Foreign Application Priority Data

Dec. 8, 1999 (JP) ............................................. 11-349132

(51) Int. Cl.⁷ ................................................ G11C 7/00
(52) U.S. Cl. ..................... 365/200; 365/225.7; 365/201; 365/189.07
(58) Field of Search .............................. 365/200, 225.7, 365/201, 189.07, 189.08, 230.06, 230.08, 230.03

(56) References Cited

U.S. PATENT DOCUMENTS 5,594,693 A * 1/1997 Rouy et al. ................. 365/200
5,848,003 A * 12/1998 Nishikawa ................... 365/200

FOREIGN PATENT DOCUMENTS

| EP | 0772202 A2 * | 5/1997 | ........... G11C/29/00 |
| JP | 63-292500 | 11/1988 | |

* cited by examiner

*Primary Examiner*—David Nelms
*Assistant Examiner*—David Lam
(74) *Attorney, Agent, or Firm*—McDermott, Will & Emery

(57) ABSTRACT

The semiconductor memory device capable of performing a repair using only the fuses for programming a defective address is provided. The semiconductor memory device is provided with at least two replacement programming circuits. Each replacement programming circuit includes a programming circuit for programming a defective address. An output of each replacement programming circuit is used as a signal for indicating whether to perform or not to perform a replacement. A word line that cannot be repaired by one replacement programming circuit is repaired using an output from another replacement programming circuit.

8 Claims, 10 Drawing Sheets

SEMICONDUCTOR MEMORY DEVICE WITH REPLACEMENT PROGRAMMING CIRCUIT

BACKGROUND OF THE INVENTION

1. Field of the Invention

The present invention relates to a semiconductor memory device having a spare memory cell.

2. Description of the Background Art

The arrangement of a main portion of a conventional semiconductor memory device will be described in relation to FIG. 10. In the diagram, memory cells are represented by reference characters m0 to m63, word lines disposed corresponding to the rows are represented by reference characters w0 to w63, and a bit line disposed corresponding to a column is represented by reference characters "bit," respectively. Further, a spare memory cell that can replace a memory cell is represented by reference characters r0, and a spare word line that can replace a word line is represented by reference characters sw0.

Bit line "bit" is connected to memory cells m0 to m63 and spare memory cell r0, and transmits data read from or to be written into memory cells m0 to m63 and spare memory cell r0. Word lines w0 to w63 are connected to memory cells m0 to m63, and each word line sends a selecting signal to a corresponding memory cell. Spare word line sw0 is connected to spare memory cell r0 and sends a selecting signal to the corresponding spare memory cell.

As shown in FIG. 10, the conventional semiconductor memory device includes a replacement control circuit 100#0, a decoder 105#0 including programming circuits 102#0 to 102#5 and logic circuits 103#0 to 103#63, a comparator 120#0, and an AND circuit 119#0. Each of replacement control circuit 100#0 and programming circuits 102#0 to 102#5 includes a fuse.

When a defective memory cell is replaced with a spare memory cell (using spare word line sw0), the fuse included in replacement control circuit 100#0 is blown. Thus, a replacement control signal R0 of a logic high or H level indicating the use of the spare memory cell will be output.

The fuse included in each of programming circuits 102#0 to 102#5 is blown according to an address of the defective memory cell. The output from the programming circuit having a blown fuse attains the H level. Signals g0 to g5 are output from programming circuits 102#0 to 102#5.

Comparator 120#0 compares a 6-bit address signal ad<0:5> with signals g0 to g5, and outputs an H level signal when a match occurs. AND circuit 119#0 activates spare word line sw0 according to replacement control signal R0 and a comparison result from comparator 120#0.

Logic circuits 103#0 to 103#63 each include AND circuits 104A and 104B and an NAND circuit 106. Logic circuits 103#0 to 103#63 are provided corresponding to a 64-bit address. Each of logic circuits 103#0 to 103#63 receives a signal g0 or an inverted signal /g0 of signal g0, a signal g1 or an inverted signal /g1 of signal g1, a signal g2 or an inverted signal /g2 of signal g2, a signal g3 or an inverted signal /g3 of signal g3, a signal g4 or an inverted signal /g4 of signal g4, and a signal g5 or an inverted signal /g5 of signal g5.

In the diagram, logic circuit 103#0 receives signals g0, g1, g2, g3, g4, and g5, while logic circuit 103#63 receives signals /g0, /g1, /g2, /g3, /g4, and /g5. NAND circuit 106 receives replacement control signal R0 and outputs from AND circuits 104A and 104B. Row address non-selection signal t0 to t63 are output from logic circuits 103#0 to 103#63, respectively.

The conventional semiconductor memory device further includes AND circuits 108#0 to 108#63. AND circuits 108#0 to 108#63 are respectively provided to word lines w0 to w63. AND circuits 108#0 to 108#63 receive row address nonselection signals t0 to t63 and decode signals a0 to a63, respectively. Decode signals a0 to a63 are obtained by decoding address signal ad<0:5> by a row decoder not shown. Word lines w0 to w63 are respectively activated according to outputs from AND circuits 108#0 to 108#63.

When the memory cells are all normal, replacement control signal R0 is at a logic low or L level so that spare word line sw0 is in the inactive state. In this case, row address non-selection signals t0 to t63 attain the H level. One of word lines w0 to w63 is activated according to decode signals a0 to a63.

When a defect is found in a memory cell and the defective memory cell is to be replaced with a spare memory cell, a fuse in replacement control circuit 100#0 and a corresponding fuse in programming circuits 102#0 to 102#5 are blown.

An example is given in which a memory cell m0 is defective. Assume that the address of word line w0 is "000000" (=ad<0:5>). In this case, all the fuses in programming circuits 102#0 to 102#5 are blown. Signals g0 to g5 all attain the H level so that signal t0 output from logic circuit 103#0 attains the L level. Consequently, when an address signal designating memory cell m0 is input and decode signal a0 attains the H level, word line w0 is not activated.

At this time, comparator 120#0 outputs an H level signal since the input address signal ad<0:5> corresponds to signals g0 to g5. As a result, spare word line sw0 is activated.

FIG. 11 shows another arrangement of the main portion of a conventional semiconductor memory device. The conventional semiconductor memory device shown in FIG. 11 has an arrangement for replacing two word lines. In the diagram, spare memory cells that can replace the memory cells are represented by reference characters r0 and r1, and spare word lines that can replace word lines are represented by reference characters sw0 and sw1.

A bit line "bit" is connected to memory cells m0 to m63 and spare memory cells r0 and r1, and transmits data read from or to be written into memory cells m0 to m63 and spare memory cells r0 and r1. Spare word lines sw0 and sw1 are connected to spare memory cells r0 and r1, and each spare word line sends a selecting signal to a corresponding spare memory cell.

As shown in FIG. 11, the conventional semiconductor memory device includes replacement control circuits 100#0 and 100#1, decoders 105#0 and 105#1, comparators 120#0 and 120#1, and AND circuits 119#0 and 119#1.

Replacement control circuit 100#1 has the same arrangement as replacement control circuit 100#0, and its fuse is blown when spare word line sw1 is to be used. Consequently, an H level replacement control signal R1 is output.

The arrangement of decoder 105#1 is the same as that of decoder 105#0. The fuse included in each of programming circuits 102#0 to 102#5 is blown according to an address of a defective memory cell. Hereinafter, the outputs from programming circuits 102#0 to 102#5 included in decoder 105#1 will be referred to as signals h0 to h5.

Each of logic circuits 103#0 to 103#63 included in decoder 105#1 receives a signal h0 or an inverted signal /h0 of signal h0, a signal h1 or an inverted signal /h1 of signal h1, a signal h2 or an inverted signal /h2 of signal h2, a signal h3 or an inverted signal /h3 of signal h3, a signal h4 or an inverted signal /h4 of signal h4, and a signal h5 or an inverted signal /h5 of signal h5. Logic circuits 103#0 to 103#63 perform logical processing according to replacement control signal R1. Row address non-selection signals output from decoder 105#1 will be referred to as signals u0 to u63.

Comparator 120#1 has the same arrangement as comparator 120#0, compares address signal ad<0:5> with signals h0 to h5, and outputs an H level signal when a match occurs. AND circuit 119#1 activates spare word line sw1 according to replacement control signal R1 and a comparison result from comparator 120#1.

The conventional semiconductor memory device shown in FIG. 11 further includes AND circuits 110#0 to 110#63 and 108#0 to 108#63. AND circuits 110#0 to 110#63 and AND circuits 108#0 to 108#63 are respectively provided to word lines w0 to w63.

An AND circuit 110#i (i=0, 1, . . . , 63) receives row address non-selection signals ti and ui. AND circuit 108#i receives a decode signal ai and an output from AND circuit 110#i.

When the row address non-selection signal output from decoder 105#0 or the row address non-selection signal output from decoder 105#1 is at the L level, the corresponding word line remains inactivate regardless of the input address signal.

When all memory cells are normal, replacement control signals R0 and R1 attain the L level so that spare word lines sw0 and sw1 are in the inactive state. On the other hand, row address non-selection signals are all at the H level so that one of word lines w0 to w63 is activated according to decode signals a0 to a63.

For instance, when defects are found in memory cells m0 and m1, fuses in replacement control circuits 100#0 and 100#1, fuses in programming circuits 102#0 to 102#5 included in decoder 105#0, and fuses in programming circuits 102#0 to 102#4 included in decoder 105#1 are blown.

As a result, replacement control signals R0 and R1 attain the H level. At this time, row address non-selection signal t0 and signal u1 attain the L level. Consequently, outputs from AND circuits 110#0 and 110#1 attain the L level, and outputs from AND circuits 110#2 to 110#63 attain the H level.

Word line w0 or word line w1 is not activated even when an address signal designating the defective memory cell m0 or the defective memory cell m1 is input (even when decode signal a0 or a1 is at the H level).

On the other hand, when the input address signal ad<0:5> corresponds to signals g0 to g5 in comparator 120#0, spare word line sw0 is activated. When the input address signal ad<0:5> corresponds to signals h0 to h5 in comparator 120#1, spare word line sw1 is activated.

Thus configured, the conventional semiconductor memory device can perform normal processing using a spare word line instead of the word line connected to a defective memory cell.

Being configured in the above-described manner, however, the conventional semiconductor memory device requires fuses (of the number that equals the number of addresses) necessary for programming the defective addresses as well as fuses for controlling the use of a spare memory cell (replacement control circuit).

Consequently, in order to replace the defective memory cells that exist over a plurality of rows by using a plurality of spare word lines, fuses of the number derived from first adding one to the number of addresses and then multiplying the sum by the number of spare word lines would be required.

As a result, when the number of spare word lines is increased for repairing defective memory cells, the region for mounting the fuses also increases, which interferes with the reduction in the overall chip area.

SUMMARY OF THE INVENTION

Thus, the present invention provides a semiconductor memory device capable of replacing a defective memory cell with a spare memory cell with small area requirement.

The semiconductor memory device according to the present invention is provided with a normal memory cell array including a plurality of memory cells arranged in a matrix of rows and columns, and a plurality of memory lines for storing data into or reading stored data from the plurality of memory cells; a spare memory cell array including a plurality of spare memory cells and a plurality of spare memory lines, each provided for replacing a defective memory line of the plurality of memory lines, for storing data into or reading stored data from a corresponding spare memory cell; and a replacement programming portion including a plurality of programming portions, each of the plurality of programming portions having a prescribed number of fuses required for programming an address of the defective memory line; and semiconductor memory device further provided with a select control circuit for performing a replacement according to a programmed state of the plurality of programming portions.

Preferably, the replacement programming portion includes a plurality of logic circuits respectively provided to the plurality of programming portions, each of the plurality of logic circuits outputs a selecting signal of a prescribed level when at least one fuse out of the prescribed number of fuses is blown. The select control circuit includes a plurality of control circuits respectively provided to the plurality of programming portions, and each of the plurality of control circuits activates a corresponding spare memory line in response to the selecting signal of the prescribed level received from a corresponding logic circuit.

More preferably, the plurality of memory lines include n memory lines (the n is an integer not less than two), and the plurality of spare memory lines includes a first spare memory line and a second spare memory line. The plurality of programming portions include a first programming portion correspondingly provided to the first spare memory line, and a second programming portion correspondingly provided to the second spare memory line. The replacement programming portion further includes a first decode circuit for generating a signal for driving to an unselected state, based on a programmed state of the first programming portion, one of (n−1) memory lines excluding a first memory line from the n memory lines, and a second decode circuit for generating a signal for driving to an unselected state, based on a programmed state of the second programming portion, one of (n−1) memory lines excluding a second memory line different from the first memory line from the n memory lines. The select control circuit further includes a circuit for inactivating the first memory line using an output from the second decode circuit when the first memory line is defective and for inactivating the second memory line using an output from the first decode circuit when the second memory line is defective.

With the above-described semiconductor memory device, the repair can be performed using only the fuses of the number required for designating the memory lines (word lines or bit lines) to be replaced. As a result, the chip area can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
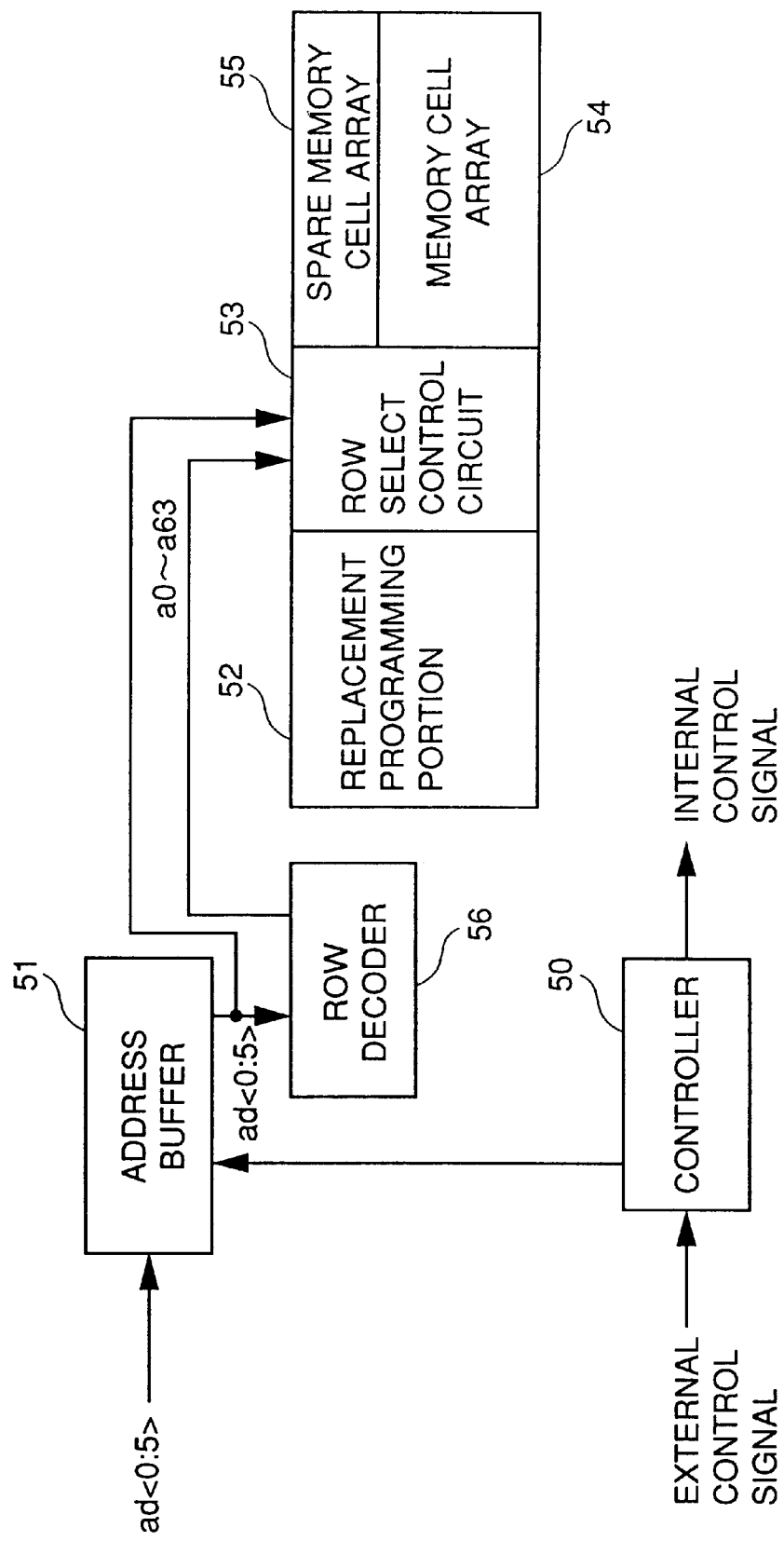
FIG. 1 is a schematic block diagram representing the overall arrangement of a semiconductor memory device 1000 according to a first embodiment of the present invention.

The embodiments of the present invention will be described hereinafter in detail with reference to the drawings. Throughout the drawings, the same or corresponding parts are denoted by the same reference characters, and the descriptions thereof will not be repeated.

First Embodiment

A semiconductor memory device 1000 according to the first embodiment of the present invention will be described in relation to FIG. 1. As shown in FIG. 1, semiconductor memory device 1000 is provided with a controller 50 for receiving an external control signal to generate a corresponding internal control signal, an address buffer 51 for taking in an address ad<0:5> according to the control by controller 50, a replacement programming portion 52, a row select control circuit 53 for selectively driving a corresponding word line, a memory cell array 54 including a plurality of memory cells, a spare memory cell array 55 including a spare memory cell for replacing a defective memory cell, and a row decoder 56 for decoding an output ad<0:5> from address buffer 51.

Figure 2:
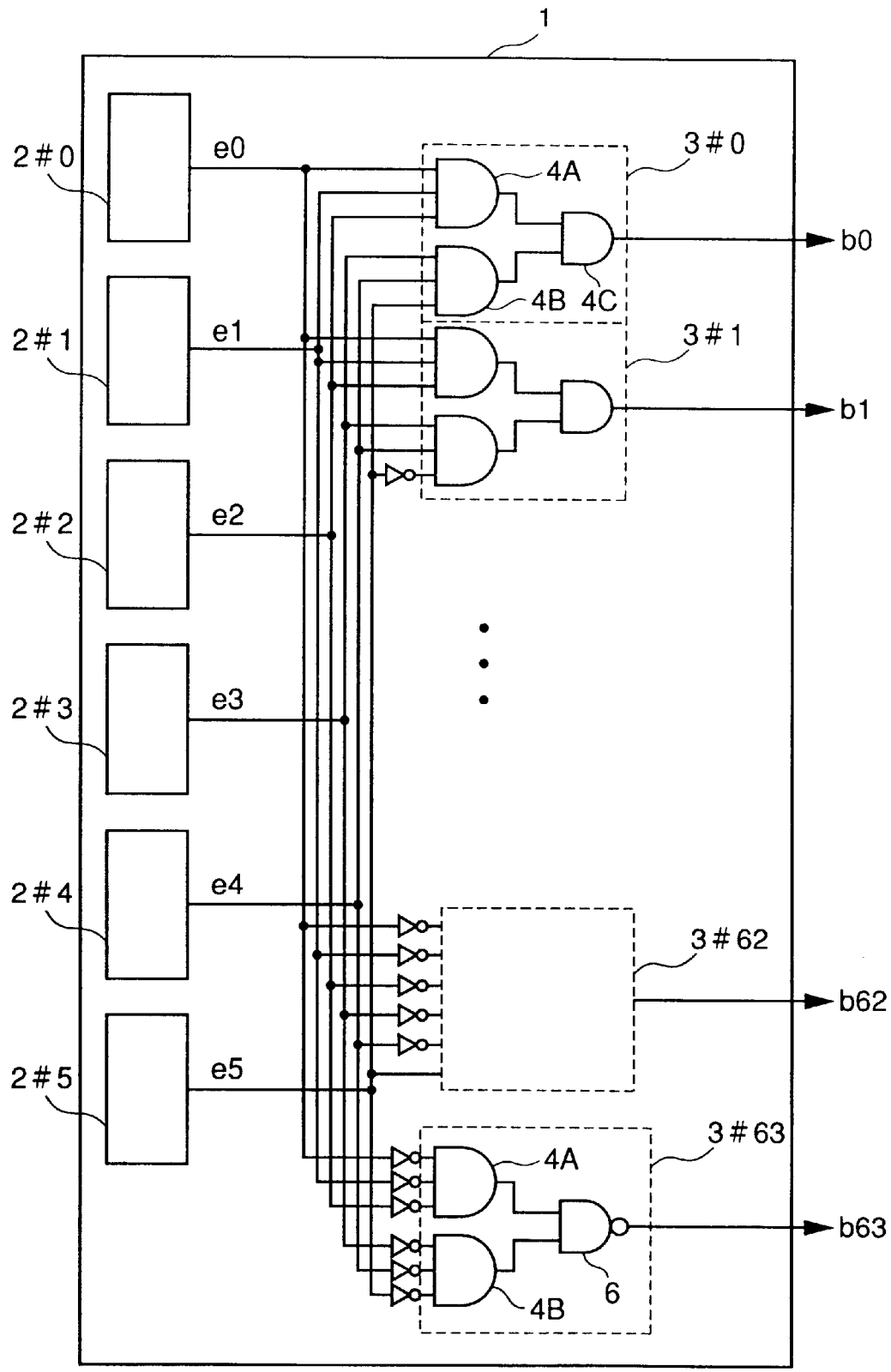
FIG. 2 is a diagram representing the arrangement of a replacement programming circuit 1 according to the first embodiment of the present invention.
Figure 3:
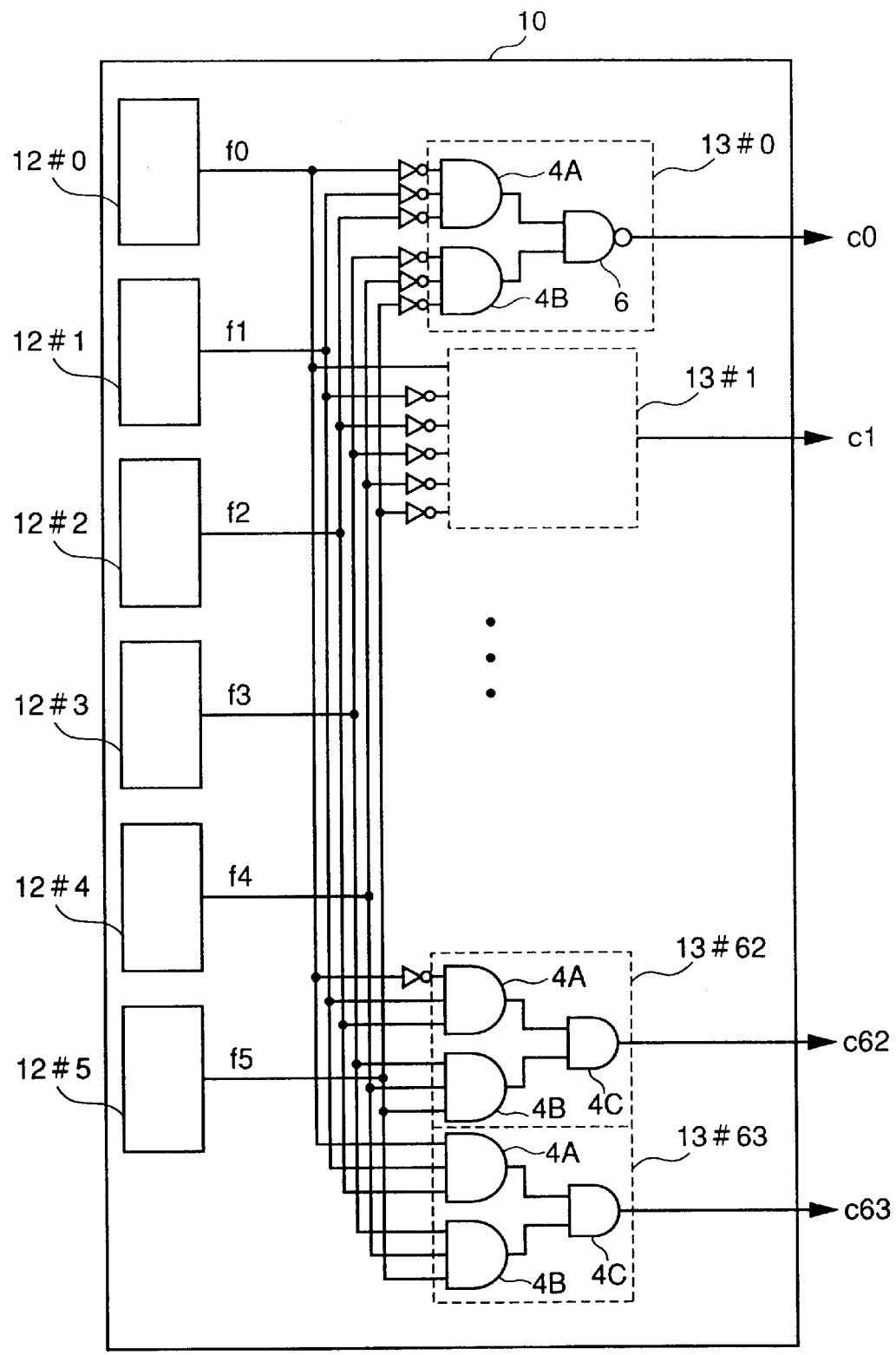
FIG. 3 is a diagram representing the arrangement of a replacement programming circuit 10 according to the first embodiment of the present invention.

Replacement programming portion 52 includes a replacement programming circuit 1 shown in FIG. 2 and a replacement programming circuit 10 shown in FIG. 3. Each of replacement programming circuits 1 and 10 includes fuses of the number required for programming a defective address. Replacement programming circuits 1 and 10 allow the replacement with two spare word lines to be performed.

Figure 4:
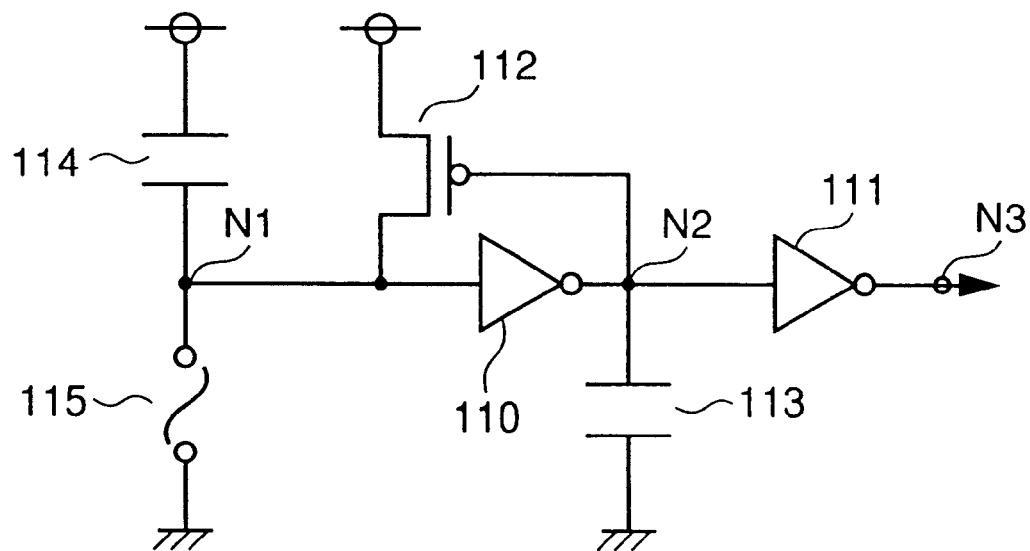
FIG. 4 is a circuit diagram representing the arrangement of a programming circuit using a fuse.

Replacement programming circuit 1 shown in FIG. 2 includes programming circuits 2#0 to 2#5 and logic circuits 3#0 to 3#63. Each of programming circuits 2#0 to 2#5 is formed by inverters 110 and 111, a PMOS transistor 112, capacitance elements 113 and 114, and a fuse 115, as shown in FIG. 4. Capacitance element 114 is connected between a powersupply node for receiving a power-supply voltage and a node N1, and fuse 115 is connected between a ground node for receiving a ground voltage and node N1. Inverter 110 is connected between a node N2 and node N1, and inverts a signal from node N1. Transistor 112 is connected between a power-supply node for receiving a power-supply voltage and node N1, and has a gate connected to node N2. Capacitance element 113 is connected between a ground node for receiving a ground voltage and node N2. Inverter 111 is connected between node N2 and an output node N3, and inverts a signal from node N2.

The fuse is blown by a laser according to an address indicating a defective memory cell. When the fuse is blown, an H level signal is output from output node N3; otherwise, an L level signal is output from output node N3.

As shown in FIG. 2, programming circuits 2#0 to 2#5 respectively output signals e0 to e5. Each of logic circuits 3#0 to 3#62 includes AND circuits 4A, 4B and 4C. Logic circuit 3#63 includes AND circuits 4A and 4B and an NAND circuit 6.

Each of logic circuits 3#0 to 3#63 receives a signal e0 or an inverted signal /e0 of signal e0, a signal e1 or an inverted signal /e1 of signal e1, a signal e2 or an inverted signal /e2 of signal e2, a signal e3 or an inverted signal /e3 of signal e3, a signal e4 or an inverted signal /e4 of signal e4, and a signal e5 or an inverted signal /e5 of signal e5.

The logic circuits respectively receive different combinations of signals. More specifically, logic circuit 3#0 receives signals e0, e1, e2, e3, e4, and e5, while logic circuit 3#63 receives signals /e0, /e1, /e2, /e3, /e4, and /e5. Signals b0 to b63 are output from logic circuits 3#0 to 3#63, respectively. When a fuse in any one of programming circuits 2#0 to 2#5 is blown, signal b63 attains the H level.

Replacement programming circuit 10 shown in FIG. 3 includes programming circuits 12#0 to 12#5 and logic circuits 13#0 to 13#63. Each of programming circuits 12#0 to 12#5 has the arrangement shown in FIG. 4, and has a fuse blown according to an address indicating a defective memory cell. Programming circuits 12#0 to 12#5 output signals f0 to f5. Each of logic circuits 13#1 to 13#63 includes AND circuits 4A, 4B, and 4C. Logic circuit 13#0 includes AND circuits 4A and 4B and an NAND circuit 6.

Each of logic circuits 13#0 to 13#63 receives a signal f0 or an inverted signal /f0 of signal f0, a signal f1 or an inverted signal /f1 of signal f1, a signal f2 or an inverted signal /f2 of signal f2, a signal f3 or an inverted signal /f3 of signal f3, a signal f4 or an inverted signal /f4 of signal f4, and a signal f5 or an inverted signal /f5 of signal f5.

The logic circuits respectively receive different combinations of signals. More specifically, logic circuit 13#63 receives signals f0, f1, f2, f3, f4, and f5, while logic circuit 13#0 receives signals /f0, /f1, /f2, /f3, /f4, and /f5.

Signals c0 to c63 are output from logic circuits 13#0 to 13#63, respectively. When a fuse in any one of programming circuits 12#0 to 12#5 is blown, signal c0 attains the H level.

Signal b63 is used as a signal for indicating whether to use or not to use a spare memory cell, and signals b0 to b62 are used to inactivate (repair) the word lines corresponding to 63 addresses out of 64 addresses. The word line corresponding to the one remaining address is inactivated using signal c63.

Similarly, signal c0 is used as a signal for indicating whether to use or not to use a spare memory cell, and signals c1 to c63 are used to inactivate (repair) the word lines corresponding to 63 addresses out of 64 addresses. The word line corresponding to the one remaining address is inactivated using signal b0.

Figure 5:
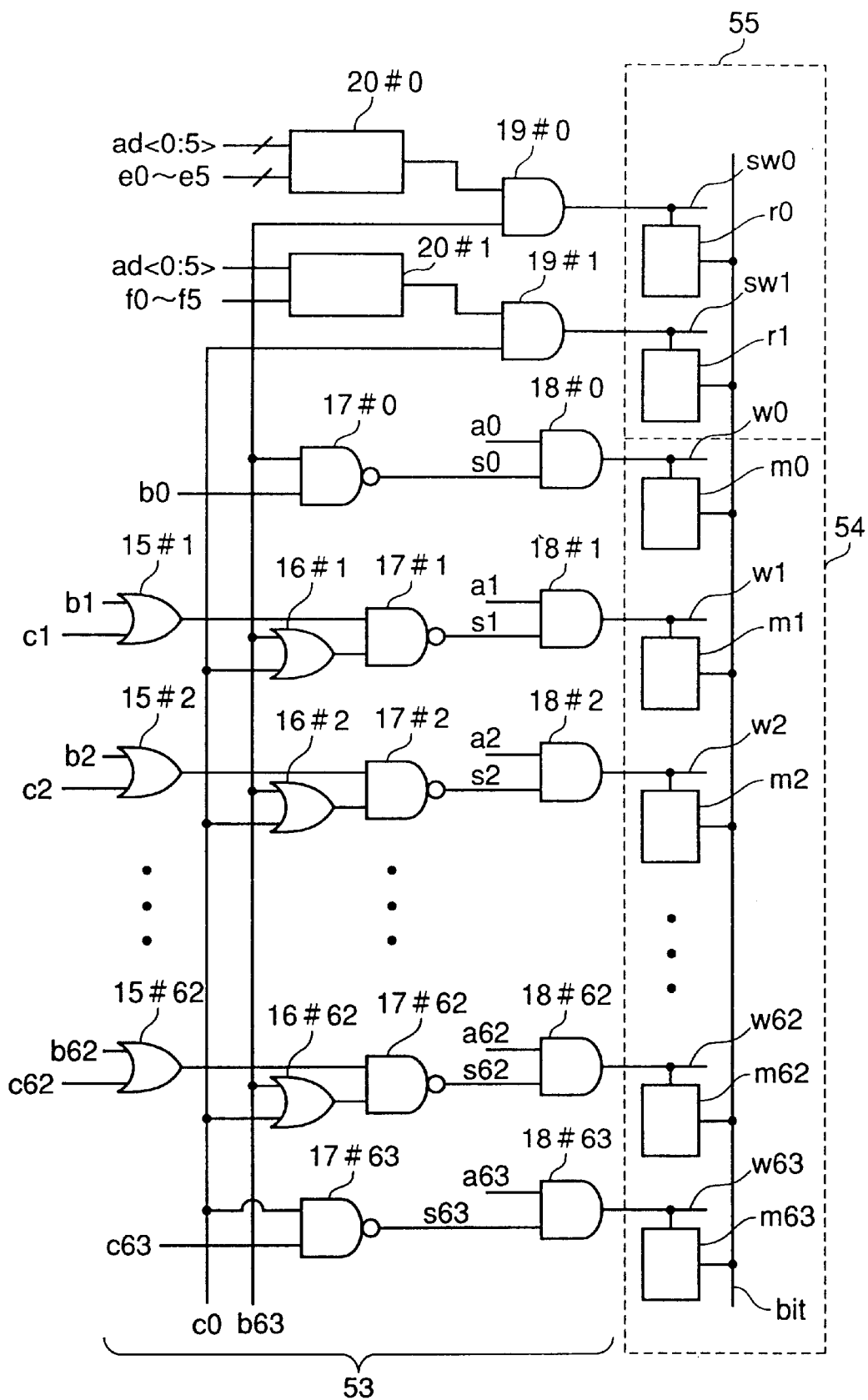
FIG. 5 is a circuit diagram related to the description of a row select control circuit 53 according to the first embodiment of the present invention.

Now, row select control circuit 53 will be described in relation to FIG. 5. FIG. 5 shows the relations between row select control circuit 53 and memory cell array 54 and spare memory cell array 55.

In the diagram, memory cells are represented by reference characters m0 to m63, word lines disposed corresponding to the rows are represented by reference characters w0 to w63, and a bit line disposed corresponding to a column is represented by the reference characters "bit," respectively. Further, spare memory cells that can replace the memory cells are represented by reference characters r0 and r1, and spare word lines that can replace the word lines are represented by reference characters sw0 and sw1.

Bit line "bit" is connected to memory cells m0 to m63 and spare memory cells r0 and r1, and transmits data read from or to be written into memory cells m0 to m63 and spare memory cells r0 and r1. Word lines w0 to w63 are connected to memory cells m0 to m63, and each word line sends a selecting signal to a corresponding memory cell. Spare word lines sw0 and sw1 are connected to spare memory cells r0 and r1, and each spare word line sends a selecting signal to a corresponding spare memory cell.

Row select control circuit 53 includes comparators 20#0 and 20#1 and AND circuits 19#0 and 19#1. Comparator 20#0 compares signals e0 to e5 with an address signal ad<0:5> and outputs an H level signal when a match occurs between signals e0 to e5 and address signal ad<0:5>; otherwise, it outputs an L level signal. AND circuit 19#0 receives an output from comparator 20#0 and a signal b63, and activates spare word line sw0. The selection of spare memory cell r0 is controlled by signal b63.

Comparator 20#1 compares signals f0 to f5 with address signal ad<0:5> and outputs an H level signal when a match occurs between signals f0 to f5 and address signal ad<0:5>; otherwise, it outputs an L level signal. AND circuit 19#1 receives an output from comparator 20#1 and signal c0, and activates spare word line sw1. The selection of spare memory cell r1 is controlled by signal c0.

Row select control circuit 53 further includes OR circuits 15#1 to 15#62 and 16#1 to 16#62, NAND circuits 17#0 to 17#63, and AND circuits 18#0 to 18#63.

For word lines w1 to w62 are disposed OR circuits 15#1 to 15#62 and 16#1 to 16#62, NAND circuits 17#1 to 17#62, and AND circuits 18#1 to 18#62, respectively.

For word line w0, an NAND circuit 17#0 and an AND circuit 18#0 are disposed. For word line w63, an NAND circuit 17#63 and an AND circuit 18#63 are disposed.

OR circuits 15#1 to 15#62 respectively receive signals b1 to b62 and signals c1 to c62. OR circuits 16#1 to 16#62 each receive signals c0 and b63.

NAND circuits 17#1 to 17#62 respectively receive outputs from OR circuits 15#1 to 15#62 and outputs from OR circuits 16#1 to 16#62. NAND circuit 17#0 receives signals b0 and b63. NAND circuit 17#63 receives signals c0 and c63. NAND circuits 17#0 to 17#63 respectively output row address non-selection signals s0 to s63.

AND circuits 18#0 to 18#63 respectively receive row address nonselection signals s0 to s63 and decode signals a0 to a63. Decode signals a0 to a63 are obtained by decoding address signal ad<0:5> by row decoder 56. Word lines w0 to W63 are respectively activated according to outputs from AND circuits 18#0 to 18#63.

Now, the operation of semiconductor memory device 1000 according to the first embodiment of the present invention will be described. First, a test is conducted for memory cells m0 to m63, and if no defect is found, none of the fuses in programming circuits 2#0 to 2#5 and 12#0 to 12#5 is blown by the laser. Programming circuits 2#0 to 2#5 and 12#0 to 12#5 output L level signals e0 to e5 and f0 to f5.

In this case, signals b63 and c0 take a value indicating that no replacement is to be performed (L level). AND circuits 19#0 and 19#1 output the L level signal. Thus, spare word lines sw0 and sw1 are not activated. On the other hand, NAND circuits 17#0 to 17#63 output the H level signals. Thus, a corresponding word line is activated in response to decode signals a0 to a63.

Next, the case in which a test is conducted for memory cells m0 to m63 and in which defects are found in memory cells m0 and m1 will be described. According to the address of a defective memory cell m0, all the fuses in programming circuits 2#0 to 2#5 are blown by the laser. According to the address of a defective memory cell m1, the fuse in programming circuit 12#0 is blown by the laser.

Signals b0 and c1 attain the H level, signals b63 and c0 take a value indicating that a replacement is to be performed (H level), and the remaining signals attain the L level.

In this case, of OR circuits 15#1 to 15#62, OR circuit 15#1 outputs an H level signal, and OR circuits 15#2 to 15#62 output L level signals. Address non-selection signals respectively output from NAND circuits 17#0 and 17#1 attain the L level, and the address non-selection signals output from NAND circuits 17#2 to 17#63 attain the H level.

Thus, even when an address signal for selecting memory cell m0 or memory cell m1 is input (even when decode signal a0 or a1 is at the H level), word lines w0 and w1 are not activated.

On the other hand, when an address signal for selecting any one of memory cells m2 to m63 is input (when one of decode signals a2 to a63 attains the H level), a corresponding word line is activated.

When address signal ad<0:5> for selecting memory cell m0 is input, comparator 20#0 outputs an H level signal, thereby activating spare word line sw0. As a result, spare memory cell r0 is accessed instead of memory cell m0.

When address signal ad<0:5> for selecting memory cell m1 is input, comparator 20#1 outputs an H level signal, thereby activating spare word line sw1. As a result, spare memory cell r1 is accessed instead of memory cell m1.

As seen from the above, according to the arrangement of the present invention, a fuse (replacement control circuit) dedicated for the switching control need not be provided, and a portion of the fuses used for designating an address can be utilized to activate a spare word line instead of the word line to which a defective memory cell is connected. Thus, the number of fuses and the layout area can be reduced.

Moreover, the arrangement of programming circuits 2#0 to 2#5 and 12#0 to 12#5 is not limited to the one shown in FIG. 4, and similar effects can be achieved by employing other arrangements.

In addition, in the present embodiment, two types of circuits, replacement programming circuits 1 and 10, are used; however, the same effect can be achieved by using either one of the two kinds of circuits.

Furthermore, although the description is given regarding the replacement of a word line, the present invention is not so limited and can be applied to the replacement per bit line.

Second Embodiment

Figure 6:
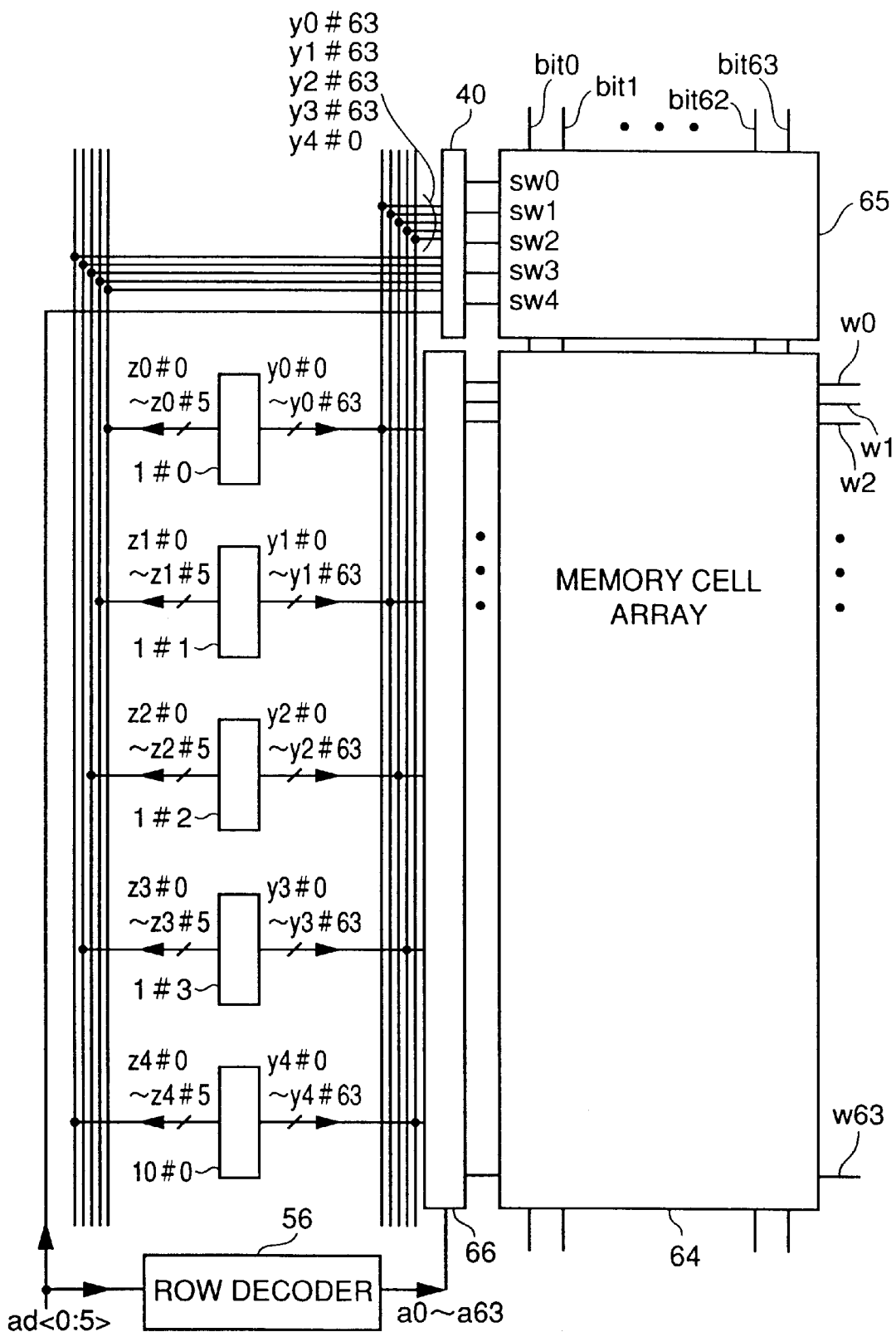
FIG. 6 is a diagram representing the arrangement of a main portion of a semiconductor memory device according to a second embodiment of the present invention.

The semiconductor memory device according to the second embodiment of the present invention will be described in relation to FIG. 6. FIG. 6 is a diagram representing the arrangement of a main portion of the semiconductor memory device according to the second embodiment of the present invention. As shown in FIG. 6, the semiconductor memory device according to the second embodiment of the present invention is provided with replacement programming circuits 1#0 to 1#3 and 10#0, a comparison portion 40, a row decoder 56, a memory cell array 64, a spare memory cell array 65, and a row select circuit 66.

Replacement programming circuits 1#0 to 1#3 have the same arrangement as that of replacement programming circuit 1 shown in FIG. 2, while replacement programming circuit 10#0 has the same arrangement as replacement programming circuit 10 shown in FIG. 3. Each of replacement programming circuits 1#0 to 1#3 and 10#0 includes fuses of the number required for designating an address of a defective memory cell.

As described above, for each of replacement programming circuits 1#0 to 1#3, one of 64 outputs is used as a signal for indicating whether to use or not to use a spare memory cell. A word line that cannot be repaired by replacement programming circuits 1#0 to 1#3 is replaced based on an output from replacement programming circuit 10#0. Replacement programming circuits 1#0 to 1#3 and 10#0 allow the repair with five spare word lines to be performed.

In the diagram, word lines disposed corresponding to the rows are represented by reference characters w0 to w63, and bit lines disposed corresponding to the columns are represented by reference characters bit0 to bit63, respectively. Further, spare word lines that can replace the word lines are represented by reference characters sw0, sw1, sw2, sw3 and sw4. Moreover, each of the bit lines is connected to a corresponding memory cell and a corresponding spare memory cell.

Programming circuits 2#0 to 2#5 included in replacement programming circuit 1#0 output signals z0#0 to z0#5, programming circuits 2#0 to 2#5 included in replacement programming circuit 1#1 output signals z1#0 to z1#5, programming circuits 2#0 to 2#5 included in replacement programming circuit 1#2 output signals z2#0 to z2#5, programming circuits 2#0 to 2#5 included in replacement programming circuit 1#3 output signals z3#0 to z3#5, and programming circuits 12#0 to 12#5 included in replacement programming circuit 10#0 output signals z4#0 to z4#5, respectively.

Logic circuits 3#0 to 3#63 included in replacement programming circuit 1#0 output signals y0#0 to y0#63, logic circuits 3#0 to 3#63 included in replacement programming circuit 1#1 output signals y1#0 to y1#63, logic circuits 3#0 to 3#63 included in replacement programming circuit 1#2 output signals y2#0 to y2#63, logic circuits 3#0 to 3#63 included in replacement programming circuit 1#3 output signals y3#0 to y3#63, and logic circuits 13#0 to 13#63 included in replacement programming circuit 10#0 output signals y4#0 to y4#63, respectively.

Signals y0#63, y1#63, y2#63, y3#63, and y4#0 are used as signals for indicating whether to use or not to use a spare memory cell. These signals attain the H level when the replacement is to be performed; otherwise, the signals attain the L level.

Figure 7:
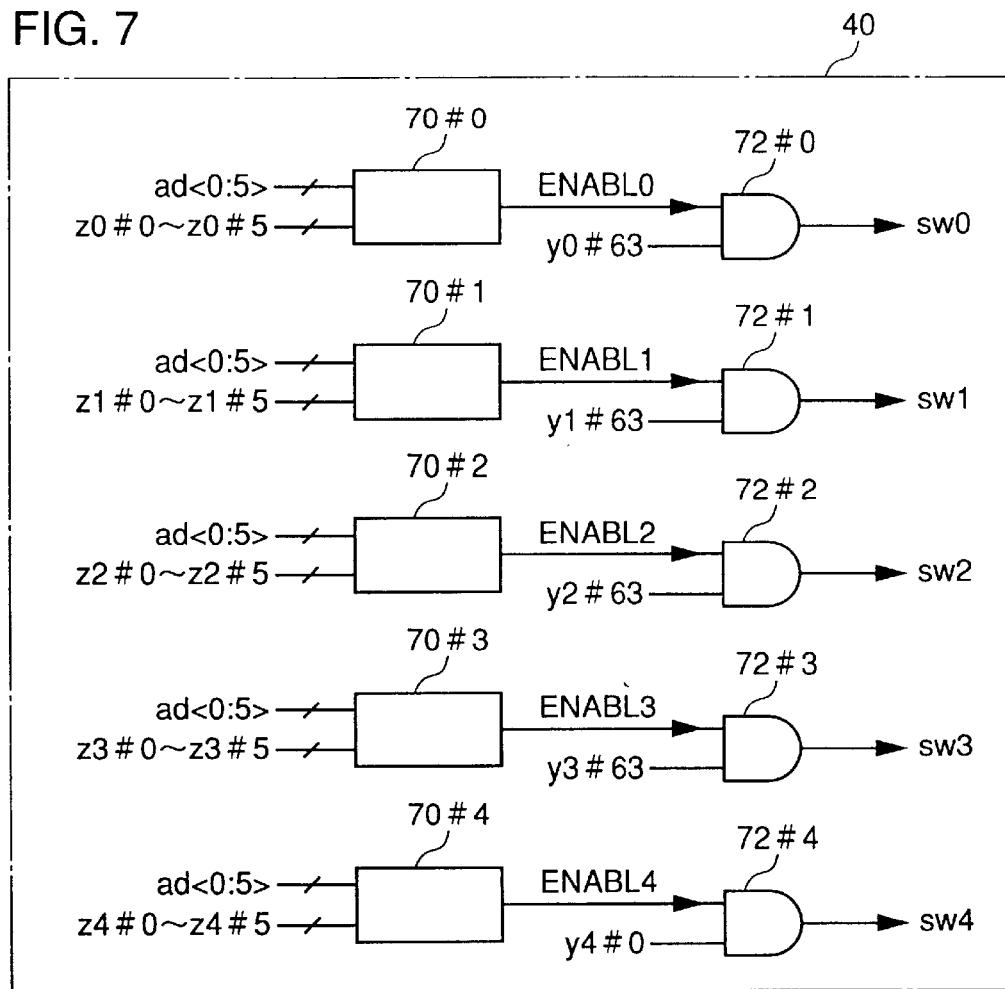
FIG. 7 is a diagram illustrating an example of the arrangement of a comparing portion 40 according to the second embodiment of the present invention.

As shown in FIG. 7, comparing portion 40 includes comparators 70#0 to 70#4 and AND circuits 72#0 to 72#4. The arrangement of comparators 70#0 to 70#4 is the same as comparator 20#0. Comparators 70#0 to 70#4 respectively output enable signals ENABL0 to ENABL4.

Figure 8A:
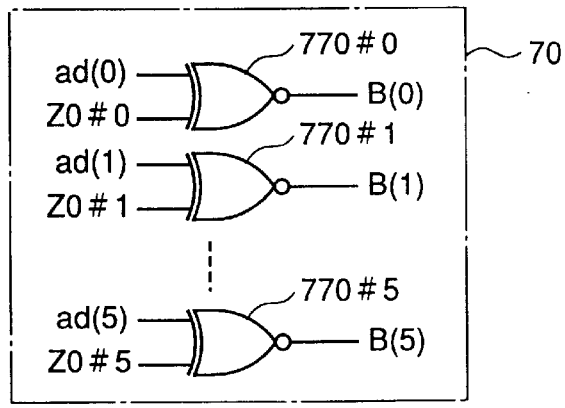
FIGS. 8A and 8B are circuit diagrams representing the arrangement of a comparator according to the second embodiment of the present invention.
Figure 8B:
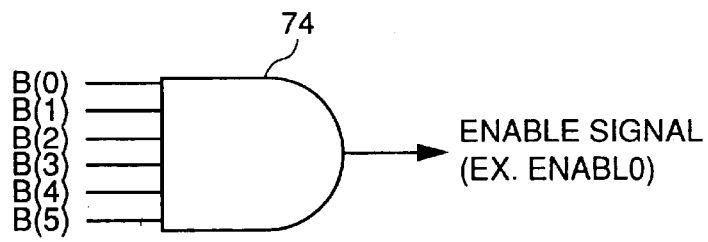

An example of the arrangement of a comparator is shown in FIGS. 8A and 8B. The comparator includes an EXNOR unit 70 shown in FIG. 8A and an AND circuit 74 shown in FIG. 8B. EXNOR unit 70 includes EXNOR circuits 770#0 to 770#5. EXNOR circuit 770#k (k=0,1, . . . ,5) receives an address signal ad(k) and an output from a programming circuit (for instance, Z0#k, Z1#k, . . . ) and outputs a signal B(k). AND circuit 74 calculates the logical product of bit B(0) to B(5) of signal B<0:5>, and outputs an enable signal (for instance, enable signal ENABL0).

As shown in FIG. 7, comparator 70#0 compares address signal ad<0:5> with signals z0#0 to z0#5. Comparator 70#1 compares address signal ad<0:5> with signals z1#0 to z1#5. Comparator 70#2 compares address signal ad<0:5> with signals z2#0 to z2#5. Comparator 70#3 compares address signal ad<0:5> with signals z3#0 to z3#5. Comparator 70#4 compares address signal ad<0:5> with signals z4#0 to z4#5.

AND circuit 72#0 activates spare word line sw0 based on an output from comparator 70#0 and a signal y0#63. AND circuit 72#1 activates spare word line sw1 based on an output from comparator 70#1 and a signal y1#63. AND circuit 72#2 activates spare wordline sw2 based on an output from comparator 70#2 and a signal y2#63. AND circuit 72#3 activates spare word line sw3 based on an output from comparator 70#3 and a signal y3#63. AND circuit 72#4 activates spare wordline sw4 based on an output from comparator 70#4 and a signal y4#0.

Row select circuit 66 shown in FIG. 6 activates word lines w0 to w63 according to decode signals a0 to a63 received from row decoder 56, signals y0#0 to y0#63, signals y1#0 to y1#63, signals y2#0 to y2#63, signals y3#0 to y3#63, and signals y4#0 to y4#63.

Figure 9:
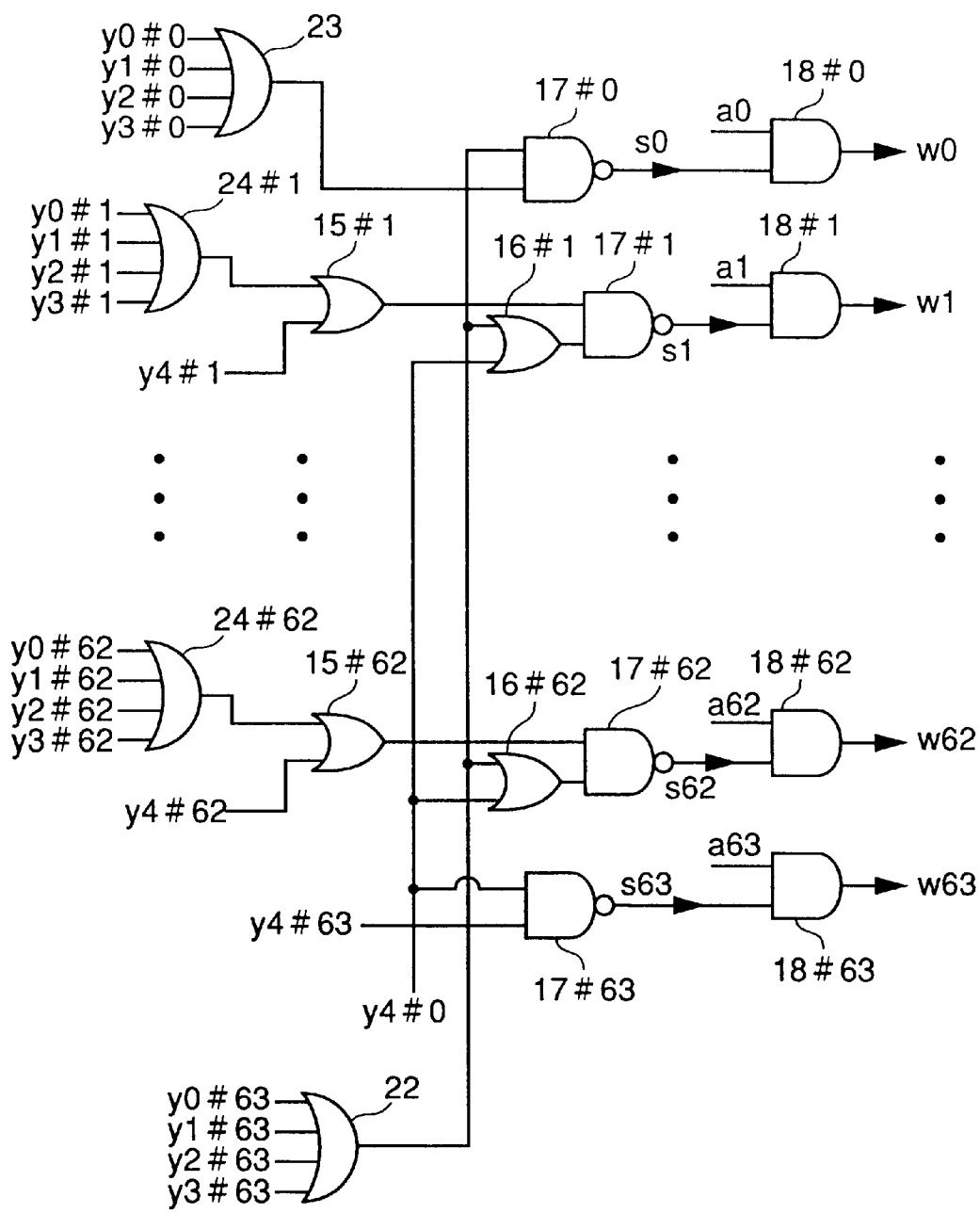
FIG. 9 is a circuit diagram illustrating an example of the arrangement of a row select circuit 66 according to the second embodiment of the present invention.
Figure 10:
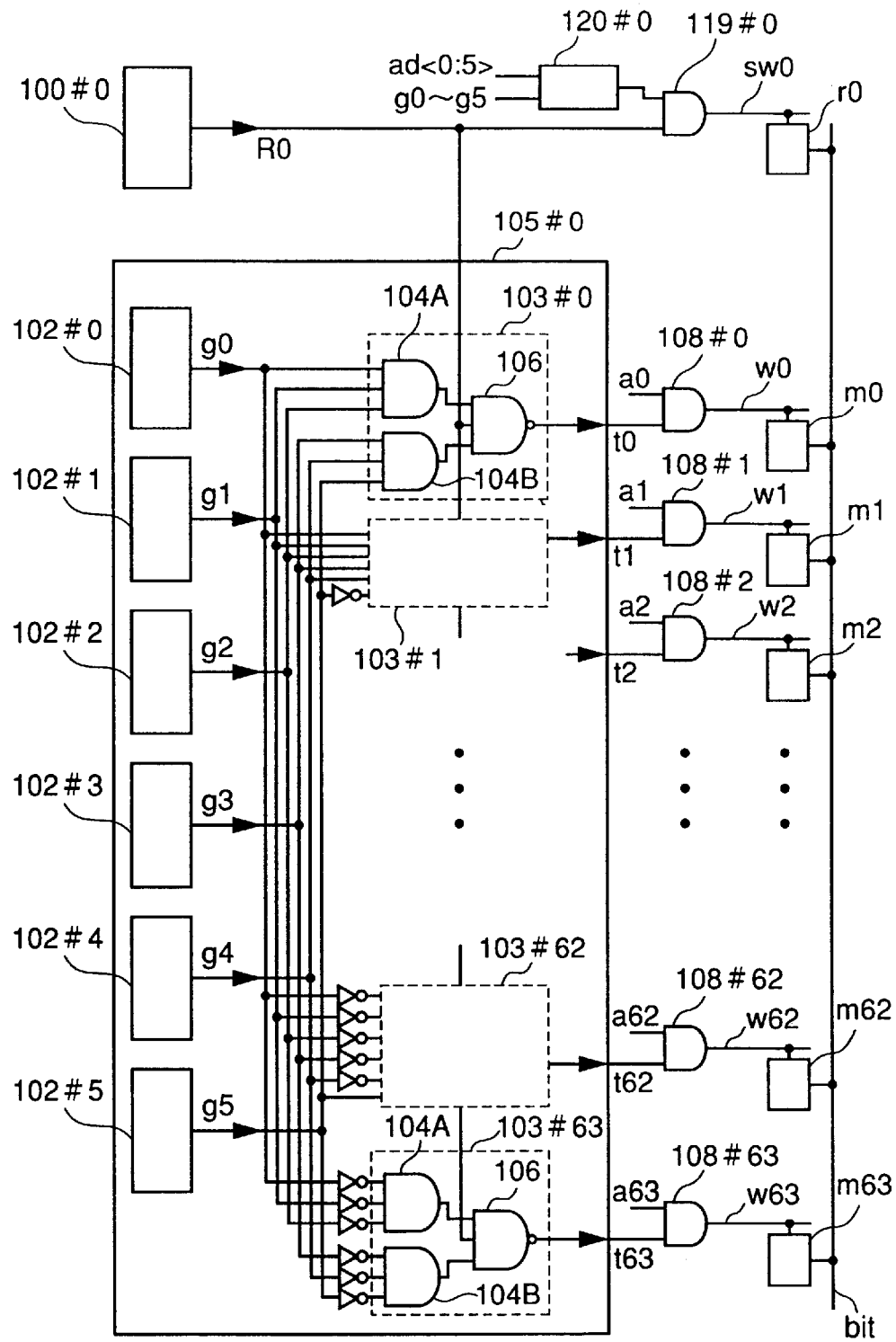
FIG. 10 is a diagram illustrating an example of the arrangement of a conventional semiconductor memory device.
Figure 11:
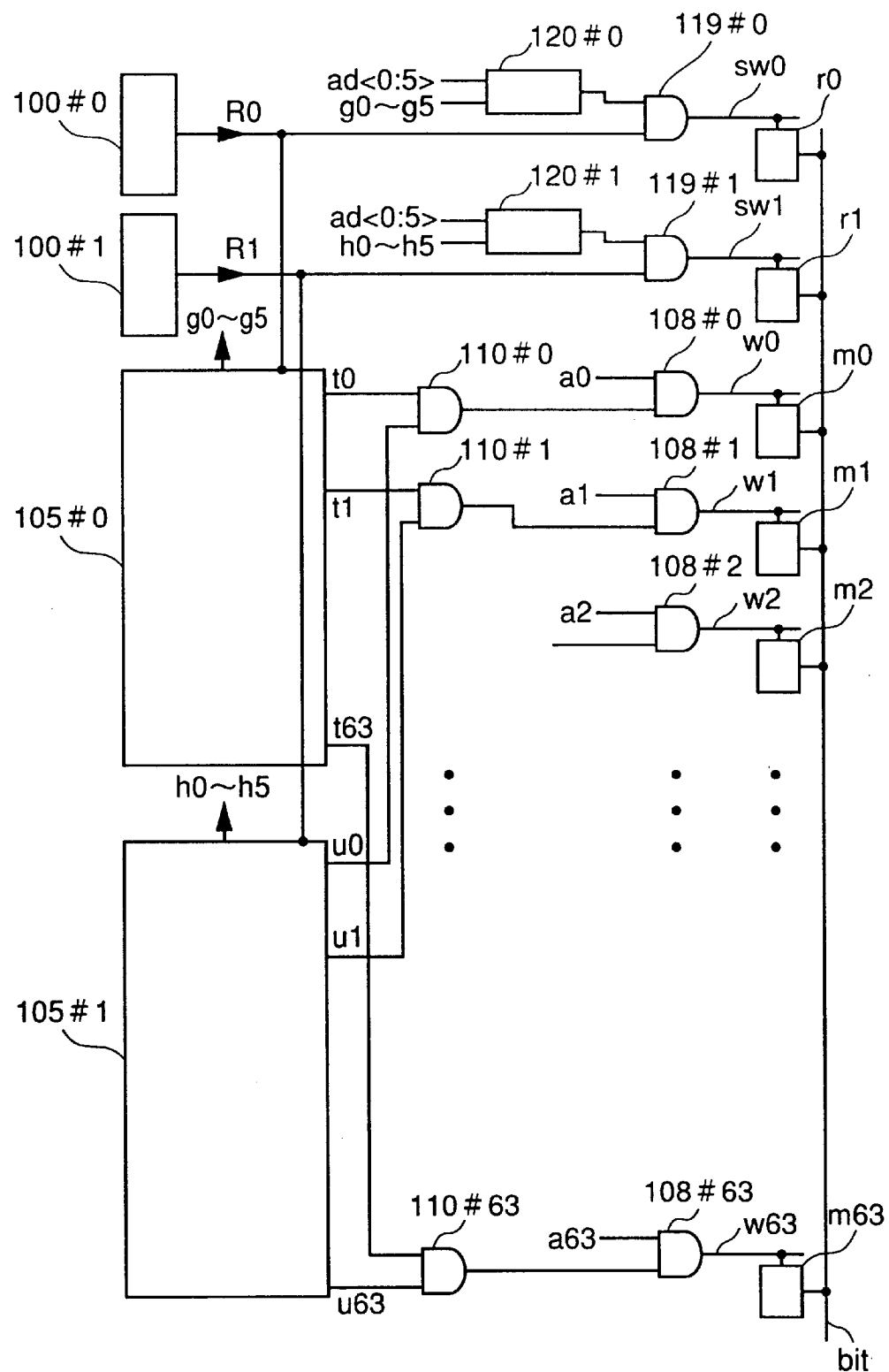
FIG. 11 is a diagram illustrating another example of the arrangement of the conventional semiconductor memory device.

An example of a specific arrangement of row select circuit 66 is shown in FIG. 9. In FIG. 9, an OR circuit 22 calculates an OR of signals y0#63 to y3#63, and an OR circuit 23 calculates an OR of signals y0#0 to y3#0. Similarly, OR circuits 24#1, . . . , 24#62 respectively calculate the OR's of signals y0#1 to y3#1, . . . , signals y0#62 to y3#62.

NAND circuit 17#0 receives an output from OR circuit 22 and an output from OR circuit 23, and NAND circuit 17#63 receives signals y4#0 and y4#63. Further, OR circuits 15#1 to 15#62 respectively receive outputs from OR circuits 24#1 to 24#62 and signals y4#1 to y4#62. Each of OR circuits 16#1 to 16#62 receives signal y4#0 and an output from OR circuit 22.

As described above, when employing a plurality of spare word lines, the semiconductor memory device can be arranged to include two types of address programming circuits (replacement programming circuits 1 and 10) for different repair locations so that every memory cell can be repaired while only a small layout area is required.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a normal memory cell array including a plurality of memory cells arranged in a matrix of rows and columns, and a plurality of memory lines for storing data into or reading stored data from said plurality of memory cells, said plurality of memory lines including first and second memory lines;
   a spare memory cell array including a plurality of spare memory cells and a plurality of spare memory lines, each provided for replacing a defective memory lines of said plurality of memory lines, for storing data into or reading stored data from a corresponding spare memory cell, said plurality of spare memory lines including first and second spare memory lines;
   a plurality of programming portions, each having a prescribed number of fuses required for programming an address of a memory line to be replaced among said plurality of memory lines, said plurality of programming portions including:
      a first programming portion capable of programming each address of a first group of lines of said plurality of memory lines including said first memory line as a memory line to be replaced with said first spare memory line, and being prevented from programming an address of said second memory line, and
      a second programming portion capable of programming each address of a second group of lines of said plurality of memory lines including said second memory line as a memory line to be replaced with said second spare memory line, and being prevented from programming an address of said first memory line, said first and second groups of lines including common memory lines; and
      a select control circuit for performing a replacement according to a programmed state of said plurality of programming portions.

2. The semiconductor memory device according to claim 1, wherein said plurality of programming portions includes a plurality of logic circuits respectively, each logic circuit outputting a selection signal according to the prescribed number of fuses therein, and
   said select control circuit includes a plurality of control circuits for activating said plurality of spare memory lines, respectively, in response to said selection signals output from said plurality of logic circuits.

3. The semiconductor memory device according to claim 2, wherein
   said first programming portion includes a first decode circuit for outputting first decode signals for inactivating said first group of lines, respectively, according to the prescribed number of fuses in said first programming circuits,
   said second programming portions includes a second decode circuit for outputting second decode signals for inactivating said second group of lines, respectively, according to the prescribed number of fuses in said second programming circuit, and
   said selection control circuit includes a circuit receiving one of said first decode signals and one of said second decode signals and inactivating the common memory line in response to the received signals.

4. A semiconductor memory device, comprising:
   a normal memory cell array including a plurality of memory cells arranged in a matrix of rows and columns, and a plurality of memory lines for storing data into or reading stored data from said plurality of memory cells, wherein said plurality of memory lines include n memory lines (said n is an integer not less than two), including first and second memory lines;
   a spare memory cell array including a plurality of spare memory cells and a plurality of spare memory lines, each provided for replacing a defective memory line of said plurality of memory lines, for storing data into or reading stored data from a corresponding spare memory cell, said plurality of spare memory lines including first and second spare memory lines;
   a plurality of programming portions, each having a prescribed number of fuses required for programming an address of a memory line to be replaced among said plurality of memory lines, said plurality of programming portions including:
      a first programming portion correspondingly provided to said first spare memory line, capable of programming each address of a first group of lines of said plurality of memory lines including said first memory line as a memory line to be replaced with said first spare memory line, and being prevented from programming an address of said second memory line,
      a second programming portion correspondingly provided to said second spare memory line, capable of programming each address of a second group of lines of said plurality of memory lines including said second memory line as a memory line to be replaced with said second spare memory line, and being prevented from programming an address of said first memory line, said first and second groups of lines including common memory lines,
      a plurality of logic circuits respectively, each logic circuit outputting a selection signal according to the prescribed number of fuses therein,
      a first decode circuit for generating a signal for driving to an unselected states, based on a programmed state of said first programming portion, one of memory lines excluding a first memory line from said n memory lines,
      a second decode circuit for generating a signal for driving to an unselected state, based on a programmed state of said second programming portion, one of memory lines; and
      a select control circuit for performing a replacement according to a programmed state of said plurality of programming portions, wherein said select control circuit includes
         a plurality of control circuits for activating said plurality of spare memory lines, respectively, in response to said selection signals output from said plurality of logic circuits, and
         a circuit for inactivating said first memory line using an output from said second decode circuit when said first memory line is defective and for inactivating said second memory line using an output from said first decode circuit when said second memory line is defective.

5. A semiconductor memory device, comprising:

a memory cell array including a plurality of memory cells arranged in a matrix of rows and columns, and a plurality of memory lines for storing data into or reading stored data from said plurality of memory cells, said plurality of memory lines including first and second memory lines:

a spare memory cell array including a plurality of spare memory cells, and a plurality of spare memory lines, each provided for replacing a defective memory line of said plurality of memory lines, and for storing data into or reading stored data from a corresponding spare memory cell, said plurality of spare memory line including first and second spare memory lines;

a plurality of programming circuits provided corresponding to a plurality of spare memory lines, each for designating a memory line of said plurality of memory lines to be replaced with the corresponding spare memory line, said plurality of programming circuits including a first programming circuit capable of designating each of a first group of lines of said plurality of memory lines including said first memory line as a memory line to be replaced with said first spare memory line, and being prevented from designating said second memory line, and a second programming circuit capable of designating each of a second group of lines of said plurality of memory lines including said second memory line as a memory line to be replaced with said second spare memory line, and being prevented from designating said second memory line, said first and second groups of lines including common memory lines; and a select control circuit for activating one or more of said plurality of spare memory lines when the corresponding one or more replacement programming circuits designate memory lines to be replaced and for inactivating said plurality of spare memory lines when said plurality of replacement programming circuits designate no memory lines to be replaced.

6. A semiconductor memory device, comprising:

a memory cell array including a plurality of memory cells arranged in a matrix of rows and columns, and a plurality of memory lines for storing data into or reading stored data from said plurality of memory cells;

a spare memory cell array including a plurality of spare memory cells, and a plurality of spare memory lines, each provided for replacing a defective memory line of said plurality of memory lines, and for storing data into or reading stored data from a corresponding spare memory cell;

a first logic circuit for outputting a first logical signal consisting of a plurality of bits, each bit generated based on same plural bits of a second logical signal, said first logical signal including a first one bit for activating one of said plurality of spare memory lines, and a second one bit for inactivating a first memory line of said plurality of memory lines;

a second logic circuit for outputting a third logical signal consisting of a plurality of bits, each bit generated based on same plural bits of a fourth logical signal different from said second logical signal, said third logical signal including a third one bit of said third logical signal for activating another of said plurality of spare memory line, and a fourth one bit for inactivating a second memory line of said plurality of memory lines different from said first memory line;

a third logic circuit for outputting a fifth logical signal consisting of a plurality of bits for inactivating predetermined ones of said plurality of memory lines excluding said first and second memory lines, each bit of the fifth logical signal generated based on excluding one bit of said first logical signal excluding the first and second one bits, and one bit of said third logical signal excluding the third and fourth one bits.

7. The semiconductor memory device according to claim 6, wherein said second and fourth logical signals have same n bits, and said first and third logical signals have same $2^n$ bits.

8. The semiconductor memory device according to claim 7, wherein said plurality of memory lines having $2^n$ memory lines, and said fifth logical signal has a number of bits equal to $2^n-2$.

* * * * *